United States Patent
Shelton et al.

(10) Patent No.: US 10,372,843 B2
(45) Date of Patent: Aug. 6, 2019

(54) VIRTUAL AIRCRAFT NETWORK

(71) Applicant: The Boeing Company, Chicago, IL (US)

(72) Inventors: Jason Wayne Shelton, Edgewood, WA (US); Patrick G. Cordell, Redmond, WA (US); Matthew Lee Benson, Tukwila, WA (US); Timothy M. Mitchell, Seattle, WA (US)

(73) Assignee: The Boeing Company, Chicago, IL (US)

( * ) Notice: Subject to any disclaimer, the term of this patent is extended or adjusted under 35 U.S.C. 154(b) by 682 days.

(21) Appl. No.: 14/175,919

(22) Filed: Feb. 7, 2014

(65) Prior Publication Data

US 2015/0227647 A1    Aug. 13, 2015

(51) Int. Cl.
*G06F 17/50* (2006.01)
*B64F 5/60* (2017.01)

(52) U.S. Cl.
CPC ............ *G06F 17/5009* (2013.01); *B64F 5/60* (2017.01); *G06F 17/509* (2013.01)

(58) Field of Classification Search
CPC ... G06F 17/5009; G06F 17/509; B64F 5/0045
USPC ..................................... 703/13, 12
See application file for complete search history.

(56) References Cited

U.S. PATENT DOCUMENTS

| 8,340,948 | B1 | 12/2012 | Song et al. |
| 8,612,581 | B1 | 12/2013 | Craig et al. |
| 8,615,384 | B2 | 12/2013 | Angus et al. |
| 2004/0030797 | A1* | 2/2004 | Akinlar ............... H04L 47/10 709/232 |
| 2008/0120081 | A1* | 5/2008 | Chandrashekar ... H04L 41/0896 703/13 |
| 2009/0112569 | A1* | 4/2009 | Angus .................. H04L 67/12 703/22 |

(Continued)

FOREIGN PATENT DOCUMENTS

EP        2579473 A2    4/2013

OTHER PUBLICATIONS

James_2011 (Flight Performance Data Logging System, Group #9 Sponsored by L-3 Communications, Dec. 15, 2011).*

(Continued)

*Primary Examiner* — Brian S Cook
(74) *Attorney, Agent, or Firm* — Yee & Associates, P.C.

(57) ABSTRACT

A system and method for performing a simulation of aircraft networks. Characteristics of components of the aircraft networks are identified. The aircraft networks include a first set of networks within a plurality of aircraft and a second set of networks configured for communication between the plurality of aircraft. Virtual implementations of the components are generated based on the characteristics of the components. A simulation of the aircraft networks is performed that includes the virtual implementations of the components processing virtual flight test data generated by the virtual implementations of the components. The virtual flight test data for the components in the aircraft networks is compared to actual flight test data from the components in the aircraft networks to form a comparison. The characteristics of the components are then modified based on the comparison.

24 Claims, 10 Drawing Sheets

(56) References Cited

U.S. PATENT DOCUMENTS

2011/0317573 A1* 12/2011 Shim .................. H04W 24/00
370/252

OTHER PUBLICATIONS

Graves_2009, Graves, H., Air Vehicle Model-Based Design and Simulation Pilot, Lockheed Martin Aeronautics.*
Mitchell_2006, Mitchell, T., Boeing Airport Wireless, Boeing Crew Information Systems, Sep. 13, 2006.*
V-Model_Defined, Archived Wikipedia dated Dec. 3, 2013 downloaded from https://en.wikipedia.org/w/index.php?title=V-Model&oldid=584833253.*
Firesmith, D., Using V Models for Testing, Nov. 11, 2013, SEI Blog downloaded from https://insights.sei.cmu.edu/sei_blog/2013/11/using-v-models-for-testing.html.*
Lundquist, P., Certification of Actel Fusion according to RTCA DO-254, 2007, LiTH-ISY-EX-ET—07/0332—SE.*
Haase_2013 (On the Line: The networking of line-replaceable units is integral to aerospace electronics. A new system is becoming a widely used tool for analysis, simulation, and testing of distributed, embedded systems, SHOWCASE 2013, aerospacetestinginternational.com, online 2013).*
Lundquist_2007 (Certification of Actel Fusion according to RTCA DO-254).*
V-Model—Wikipedia archived version dated Dec. 3, 2013.*
Firesmith, D., Using V Models for Testing, dated Nov. 11, 2013.*
Systems Engineering Fundamentals, Supplementary Text Prepared by the Defence Acquisition University Press Fort Belvoir, Virginia, Jan. 2001.*
Brehmer_2013 (A Bright Idea: Organge Avionics Dataloggers Log CAN bus data for flight tests in pursuit of sporadic errors, SHOWCASE 2014, Aerospacetestinginternational.com, online Nov. 20, 2013).*
Sefguide_2001 (Systems Engineering Fundamentals, DOD, Defense Acquisition University Press, 2001).*
Calvert_1997 (Modeling Internet Topology, IEEE Communications Magazine, Jun. 1997).*
Hangan_2008 (Real-time Data Flow Scheduling for Distributed Control, International Journal on Advances in Networks and Services, vol. 1 on 1, year 2008).*
Lundquist_2007 (Certification of Actel Fusion according to RTCA DO-254 2007).*
Frontiers_2003 (Boeing Frontiers vol. 02, Issue 02 Jun. 2003).*
Extended European Search Report, dated Jul. 2, 2015, regarding Application No. EP15154036.6, 9 pages.
European Patent Office Communication, dated Sep. 22, 2016, regarding Application No. 15154036.6, 4 pages.

* cited by examiner

VIRTUAL AIRCRAFT NETWORK

BACKGROUND INFORMATION

1. Field

The present disclosure relates generally to data processing and, in particular, to simulating data processing systems. Still more particularly, the present disclosure relates to a method and system for simulating components of aircraft networks.

2. Background

Commercial aircraft often include a number of data processing systems used to perform various functions for the aircraft. For example, without limitation, aircraft data processing systems are used to monitor flight sensors, control the aircraft during stages of operation, communicate with other components within the aircraft, identify threats, generate feedback for flight crew, and perform other suitable types of functions. The size and capability of these aircraft data processing systems depend on the type of functions that need to be performed for the aircraft.

Some primitive aircraft data processing systems used discrete inputs and one-way busses to communicate between various components in the system. In more modern illustrative examples, aircraft data processing systems are connected to different types of aircraft networks. Because the amount of digital information required to operate and maintain commercial aircraft is steadily increasing, the importance of integrating aircraft data processing systems onto networks is also increasing.

Typically, aircraft data processing systems, or simply, "aircraft systems," of modern commercial aircraft interface with each other over networks configured within the aircraft. Connecting aircraft systems to networks allows the aircraft systems to exchange information over the networks. These aircraft systems can operate as a client, server, or a combination of client and server on the networks.

The configuration of the networks selected to integrate these aircraft systems may depend on a number of different considerations. For example, the configuration of the aircraft network may be selected based on the type of aircraft, the desired functions performed by the aircraft, certification requirements, and security concerns, among others considerations.

In addition to communication between various aircraft systems within an aircraft, aircraft networks also may provide communication with entities outside the aircraft. For instance, networks also allow the aircraft systems to communicate with computers on the ground, with other aircraft or fleets of aircraft, and other entities. This communication may be directed over private networks, the internet, or in another suitable manner.

Aircraft systems need to be robust, secure, and reliable. In some cases, components within the aircraft systems may not perform as desired. For example, data may not be exchanged between components efficiently. Moreover, some components within the aircraft systems may need modification to communicate effectively with other entities over the aircraft networks. Testing and modification may be performed to correct these issues. Testing each of the components of these aircraft systems, however, may be more complex and time-consuming than desired. Therefore, it would be desirable to have a method and apparatus that take into account at least some of the issues discussed above, as well as other possible issues.

SUMMARY

In one illustrative embodiment, a method for performing a simulation of aircraft networks is presented. Characteristics of components of the aircraft networks are identified. The aircraft networks include a first set of networks within a plurality of aircraft and a second set of networks configured for communication between the plurality of aircraft. Virtual implementations of the components are generated based on the characteristics of the components. A simulation of the aircraft networks is performed that includes the virtual implementations of the components processing virtual flight test data generated by the virtual implementations of the components. The virtual flight test data for the components in the aircraft networks is compared to actual flight test data from the components in the aircraft networks to form a comparison. The characteristics of the components are then modified based on the comparison.

In another illustrative embodiment, an aircraft network simulation system comprises a memory, a processor unit, and aircraft network simulation software. The memory has characteristics of components of aircraft networks. The aircraft network simulation software is executable by the processor unit and configured to identify the characteristics of the components of the aircraft networks. The aircraft networks include a first set of networks within a plurality of aircraft and a second set of networks configured for communication between the plurality of aircraft. The aircraft network simulation software is also configured to generate virtual implementations of the components based on the characteristics of the components. The aircraft network simulation software is further configured to perform a simulation of the aircraft networks that includes the virtual implementations of the components processing virtual flight test data generated by the virtual implementations of the components. The aircraft network simulation software is still further configured to compare the virtual flight test data for the components in the aircraft networks to actual flight test data from the components in the aircraft networks to form a comparison. The aircraft network simulation software is configured to then modify the characteristics of the components based on the comparison.

In yet another illustrative embodiment, a method for managing threats using simulated components of aircraft networks is presented. Characteristics of the components of the aircraft networks are identified. User input is received for a modification to a number of the characteristics of the components. The modification represents a threat to a component in the components. Virtual implementations of the components are generated based on the modification to the number of the characteristics of the components. A simulation of the aircraft networks is performed that includes the virtual implementations of the components processing virtual flight test data generated by the virtual implementations of the components. User input is received selecting a plurality of the components of the aircraft networks. The virtual flight test data for the selected plurality of the components is compared to previous virtual flight test data performed in a previous simulation to form a comparison. A real time view of the processing of the simulation is displayed based on the comparison. The real time view shows state changes for the selected plurality of the components.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that it may be desirable to perform simulations of aircraft systems and aircraft networks for various purposes. In performing these simulations, many types of components need to be simulated. These components may be located on aircraft as part of aircraft systems or outside of aircraft. For instance, some simulated components may be located on the ground and on satellites.

The illustrative embodiments also recognize and take into account that each aircraft may have different types of equipment that use different components or combinations of components. Entities outside of aircraft also may use a multitude of different components. As a result, the number and type of components can vary significantly in a simulation of an aircraft network. These variations in types of components among entities may make simulating aircraft networks more difficult and time-consuming than desired. Moreover, the simulations may not provide sufficient information to operators about the simulated performance of components across the aircraft network.

The illustrative embodiments further recognize and take into account that it may be desirable to modify the types of components used in aircraft systems. These modifications may include the use of new components or may be changes in existing components. The illustrative embodiments recognize and take into account, however, that modified components may result in possible threats to an aircraft network. In addition, entities outside the network may threaten the vitality of the network. As a result, it may be desirable to test the performance of these modified components over the aircraft network. In some cases, the process of identifying threats to the aircraft network may be more costly or time-consuming than desired.

Thus, the illustrative embodiments provide a method and system for performing a simulation of aircraft networks. In an illustrative example, characteristics of components of the aircraft networks are identified. The aircraft networks include a first set of networks within a plurality of aircraft and a second set of networks configured for communication between the plurality of aircraft. Virtual implementations of the components are generated based on the characteristics of the components. A simulation of the aircraft networks is performed that includes the virtual implementations of the components processing virtual flight test data generated by the virtual implementations of the components. The virtual flight test data for the components in the aircraft networks is compared to actual flight test data from the components in the aircraft networks to form a comparison. The characteristics of the components are then modified based on the comparison.

Figure 1:
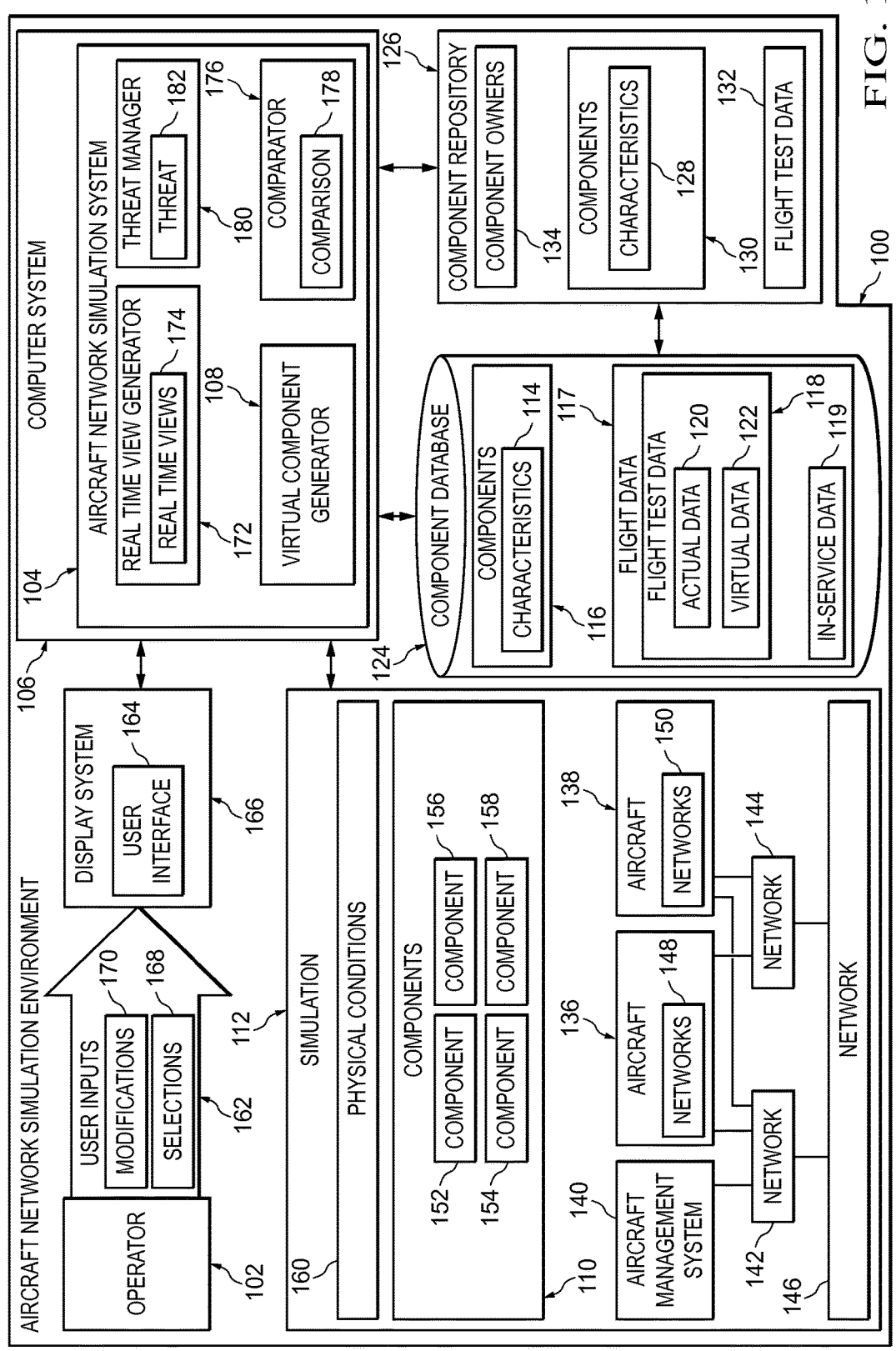
FIG. 1 is an illustration of a block diagram of an aircraft simulation environment in accordance with an illustrative embodiment.

Referring now to the figures and, in particular, with reference to FIG. 1, an illustration of a block diagram of an aircraft network simulation environment is depicted in accordance with an illustrative embodiment. Various aircraft systems and networks used for a number of different types of aircraft may be simulated in aircraft network simulation environment 100.

In this illustrative example, aircraft network simulation environment 100 includes operator 102 and aircraft network simulation system 104. Operator 102 is a person or system that interacts with components within aircraft network simulation environment 100. Operator 102 manages aircraft network simulation system 104 in this illustrative example.

As depicted, aircraft network simulation system 104 may be implemented in computer system 106. Computer system 106 is one or more computers. When more than one computer is present in computer system 106, those computers are in communication with each other over a communications medium such as a network. Aircraft network simulation system 104 comprises various systems integrated to run simulation 112.

In this illustrative example, aircraft network simulation system 104 includes virtual component generator 108. Virtual component generator 108 generates components 110 for use in simulation 112.

Components 110 may be virtual implementations for components 116 stored in component database 124. Components 116 are actual components used in physical aircraft.

Components 116 have characteristics 114 in this illustrative example. Characteristics 114 may be behaviors, traits, or physical structures indicative of the performance of components 110. Components 116 for a particular aircraft may differ based on various types, models, sub-models, options, configurations for airline modifiable information (AMI), and other attributes of the aircraft.

In this illustrative example, virtual component generator 108 generates components 110 of simulation 112 based on at least one of characteristics 114 of components 116, flight data 117, or any other suitable type of data for generating components in aircraft network simulation environment 100.

Flight data 117 includes flight test data 118 and in-service data 119 in this illustrative example.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination. As used herein, a "number of" items is one or more items.

In this illustrative example, flight test data 118 is data recorded from previous operations of aircraft, simulations of aircraft, or a combination thereof. For example, flight test data 118 may include one or both of actual data 120 and virtual data 122.

In this illustrative example, flight data 117 may be continuously updated by in-service data 119. In-service data 119 is a type of actual data that has been generated over the life of the aircraft. In-service data 119 may be data generated by at least one of components 116. Aircraft network simulation system 104 uses in-service data 119 to build on flight test data 118 obtained in previous tests to perform more accurate and helpful simulations. In other words, flight data 117 used to run simulation 112 includes actual data 120 from tests of the aircraft prior to entering into service, virtual data 122 from previous simulations, and in-service data 119 updated as it becomes available.

As depicted, characteristics 114 of components 116 and flight data 117 are stored in component database 124. Component database 124 is a storage device in aircraft network simulation environment 100. Component database 124 is located in a remote location from other components in aircraft network simulation environment 100 in this illustrative example. In other illustrative examples, component database 124 may be part of aircraft network simulation system 104, computer system 106, or both.

As depicted, aircraft network simulation environment 100 may also include component repository 126. In this illustrated example, component repository 126 is a storage device located in a remote location from other components in aircraft network simulation environment 100. In other illustrative examples, component repository 126 may be implemented in at least one of aircraft network simulation system 104, computer system 106, component database 124, or any other suitable components in aircraft network simulation environment 100.

In this illustrative example, component owners 134 manage component repository 126. Component owners 134 may be a number of different types of entities such as a government, a company, a private individual, or other suitable entities. For example, a component owner in component owners 134 may be a company that owns one or more components in components 130.

As depicted, component owners 134 manage characteristics 128 of components 130 and flight test data 132. Characteristics 128 of components 130 and flight test data 132 are stored in component repository 126. Characteristics 128 of components 130 are an example of characteristics 114 of components 116 and flight test data 132 is an example of flight test data 118.

In the illustrative example, simulation 112 includes aircraft 136, aircraft 138, aircraft management system 140, network 142, network 144, and network 146. In this example, aircraft management system 140 is at least one of an aircraft management system located in an aircraft, an aircraft management system located on the ground, or other suitable types of aircraft management systems. In other examples, simulation 112 may include any number of aircraft, any number of suitable networks, and any number of aircraft management systems.

For example, without limitation, aircraft management system 140 may take the form of a flight control computer (FCC), an auto-throttle computer, a flight management computer (FMC), an aircraft conditioning and monitoring function (ACMF), a stall warning computer, an auto pilot, and other types of aircraft management and monitoring systems within the aircraft. Additionally, on the ground, aircraft management system 140 may take the form of a global positioning system, a differential global positioning system, radar, and weather radar, among others.

In the illustrated example, network 142 is used in communications between the various aircraft and aircraft management system 140 in simulation 112. For example, network 142 is used in communications between at least one of aircraft 136, aircraft 138, or other aircraft in simulation 112 and aircraft management system 140.

Network 144 is used in communications between aircraft 138 and aircraft 136 in simulation 112. In this illustrative example, network 146 takes the form of at least one of the internet, a private network, or other suitable types of networks in aircraft network simulation environment 100.

As depicted, aircraft 136 includes networks 148 and aircraft 138 includes networks 150. Networks 148 and networks 150 are virtual representations of in-aircraft networks in this illustrative example. In other words, networks 148 are used in communications between components of aircraft 136 and networks 150 are used in communications between components of aircraft 138 of simulation 112.

As illustrated, components 110 of simulation 112 include component 152, component 154, component 156, and component 158. Component 152 is an example of a virtual implementation of a component of aircraft management system 140, while component 154 is an example of a virtual implementation of a component of aircraft 136. Component 156 is an example of a virtual implementation of a component of aircraft 138 and component 158 is an example of a virtual implementation of a networking component of at least one of network 142, network 144, network 146, networks 148, or networks 150.

In this illustrative example, aircraft network simulation system 104 processes simulation 112 using components 110. Aircraft network simulation system 104 uses a set physical conditions 160 as input to the processing of simulation 112. In this illustrative example, a "set" of items is one or more items. A set of physical conditions 160 includes one or more conditions. Physical conditions 160 may include attributes such as, for example, without limitation, data loads, throttle settings, flap settings, control surfaces (e.g., slats, elevators, spoilers and ailerons), various flight phases (e.g., doors closed, engines operational, taxi, take-off, climb, cruise, decent, flare, touchdown, break set, and air-ground transitions), communication with the control centers, and other suitable types of physical characteristics.

As illustrated, operator 102 provides user inputs 162 to user interface 164 of display system 166. Display system 166 may take various forms. For example, the number of display devices in display system 166 may be selected from at least one of a computer screen, a tablet, a mobile phone, a touch screen device, or some other suitable type of display system. Display system 166 also may include a number of display devices in some illustrative examples.

User interface 164 is displayed by display system 166 and facilitates interaction with operator 102. Operator 102 may enter user inputs 162 into user interface 164 using one or more input devices selected from at least one of a keyboard, a mouse, a joystick, a microphone, a tablet, a touch screen, or other suitable types of input devices.

In this illustrative example, operator 102 uses aircraft network simulation system 104 to provide selections 168 of one or more components 116 in component database 124. Aircraft network simulation system 104 may include aircraft network simulation software executable by a processor unit in this illustrative example.

In this depicted example, operator 102 may make selections 168 to identify components to be displayed on user interface 164. Operator 102 also uses aircraft network simulation system 104 to provide modifications 170 to characteristics 114 of components 116. For example, changes made by operator 102 to characteristics 114 of components 116 may represent a threat to one of components 116.

As depicted, aircraft network simulation system 104 also includes real time view generator 172. In this illustrative example, real time view generator 172 generates real time views 174 of simulation 112 for display on user interface 164. Real time views 174 of simulation 112 are based on at least one of actual data 120 or virtual data 122 generated by components 110 of simulation 112.

Comparator 176 in aircraft network simulation system 104 generates comparison 178. In this illustrative example, comparison 178 is based on differences between actual data 120 and virtual data 122. As another example, comparison 178 may be based on differences between virtual data of previous simulations and virtual data of subsequent simulations.

In this depicted example, threat manager 180 in aircraft network simulation system 104 identifies threat 182 from comparison 178. For example, threat 182 may take the form of a cyber-threat, a hack, a component malfunction, a system time out, a communication loss, or some other type of threat. Threat 182 may be identified from changes in at least one of latitude position data, longitude position data, flight phase, control setting, course, altitude, break setting, and other changes.

Figure 2:
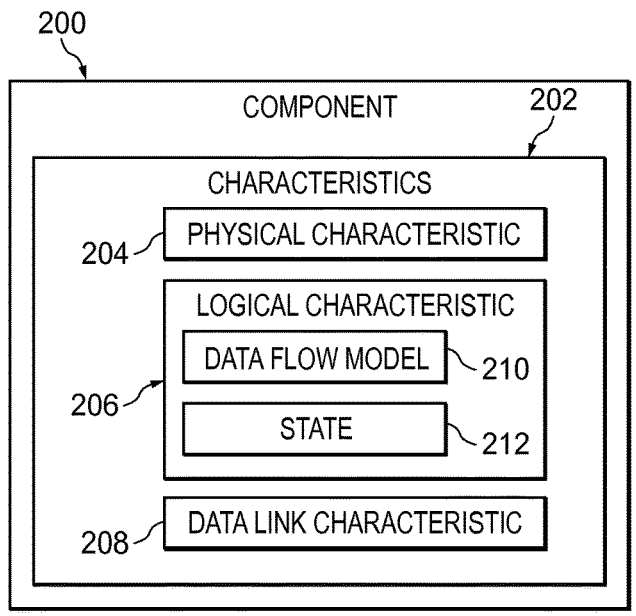
FIG. 2 is an illustration of a block diagram of characteristics of a component in accordance with an illustrative embodiment.

Turning now to FIG. 2, an illustration of a block diagram of characteristics of a component is depicted in accordance with an illustrative embodiment. Characteristics 202 of component 200 in FIG. 2 are an example of characteristics 114 of components 116 in FIG. 1.

As depicted, characteristics 202 may include least one of physical characteristic 204, logical characteristic 206, and data link characteristic 208. In the illustrative example, physical characteristic 204 is at least one of temperature sensitivity ranges, moisture sensitivity ranges, electrical sensitivity ranges, or other suitable types of physical characteristics of component 200.

In this depicted example, logical characteristic 206 is at least one of data flow model 210, state 212 of component 200, configuration information for component 200, or other suitable types of logical characteristics of component 200. Data flow model 210 is a sequence of operations performed by component 200 based on inputs. For example, in response to a particular input, data flow model 210 may direct component 200 to output a particular result. As another example, in response to receiving a particular input, data flow model 210 may direct component 200 to change state 212 of component 200.

State 212 may include an indication of at least one of component 200 is running, component 200 is stopped, component 200 has encountered a problem, component 200 is operating within established guidelines, component 200 has received a particular input, component 200 is busy processing input, component 200 is communicating with another component, and other suitable states of component 200. Data link characteristic 208 is at least one of a reference to another component, a protocol used to communicate with other components, or other suitable types of data link characteristics.

When data link characteristic 208 is a protocol, data link characteristic 208 may be a version of an internet protocol. For instance, data link characteristic 208 may be internet protocol version four (IPV4), internet protocol version six (IPV6), and other suitable internet protocols. As an example, communications between component 200 and another component may be simulation using IPV4, again simulated using IPV6, and the results compared.

In one illustrative example, overloaded data links for component 200 may result in state 212 of component 200 that causes system time-outs. If component 200 and other components go offline, the overall system capability may be degraded, compromised, or both.

In some cases, aircraft systems require a high degree of redundancy. Without this redundancy for components within the aircraft system, undesired results may occur. For instance, if component 200 is part of one of a navigation system, a monitoring system, a guidance system, or a control system, and component 200 is not responding, the aircraft may be diverted to an alternate airport, which may be both inconvenient and expensive.

Figure 3:
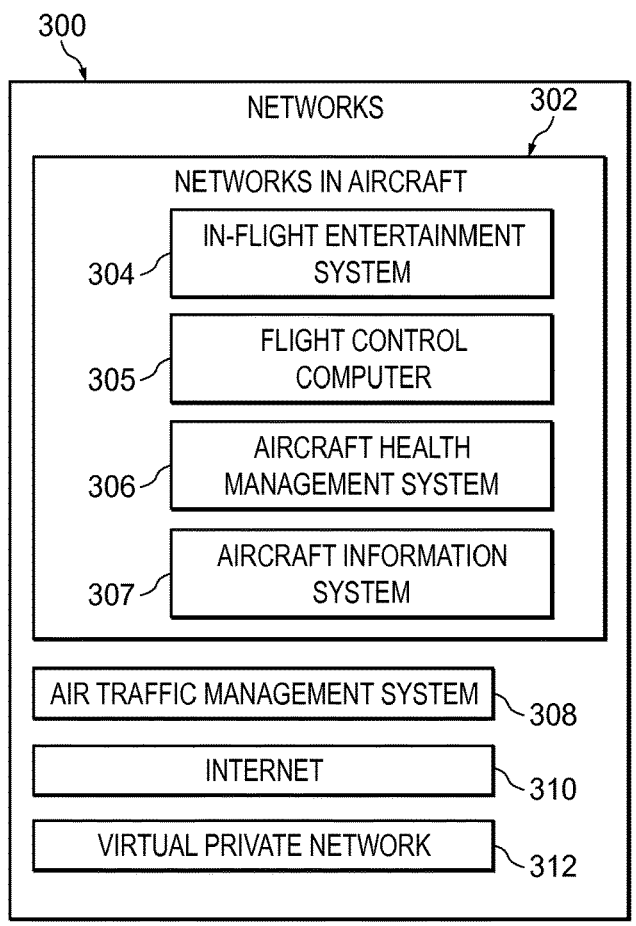
FIG. 3 is an illustration of a block diagram of networks simulated by an aircraft simulation environment in accordance with an illustrative embodiment.

Turning next to FIG. 3, an illustration of a block diagram of networks simulated by an aircraft simulation environment is depicted in accordance with an illustrative embodiment. In this illustrative example, networks 300 are examples of networks in simulation 112 in FIG. 1. Networks in aircraft 302 are examples of networks 148 and networks 150.

Networks in aircraft 302 may include in-flight entertainment system 304, flight control computer 305, aircraft health management system 306, and aircraft information system 307. In this illustrative example, in-flight entertainment system 304 provides audio, video, multimedia, internet, or other communications for aircraft 136 in FIG. 1.

Flight control computer 305 uses feedback systems to maintain heading and altitude for aircraft 136 in this illustrative example. Aircraft health management system 306 monitors the health and state of various components within aircraft 136, while aircraft information system 307 provides temporal data such as weather, airport conditions, and other suitable information.

As depicted, air traffic management system 308 functions and air traffic control on the ground side. Air traffic management system 308 is an example of aircraft management system 140 in FIG. 1. Internet 310 and virtual private network 312 are examples of network 146 in FIG. 1.

Various types of data may be held and communicated over networks in aircraft 302 and other networks 300 located outside of aircraft 136. For instance, maintenance records, deferrals, performance and configuration data, and other types of data are held in networks in aircraft 302. Additionally, flight manifests, fuel invoices, and cargo invoices may be stored and controlled on networks outside of aircraft 136.

Figure 4:
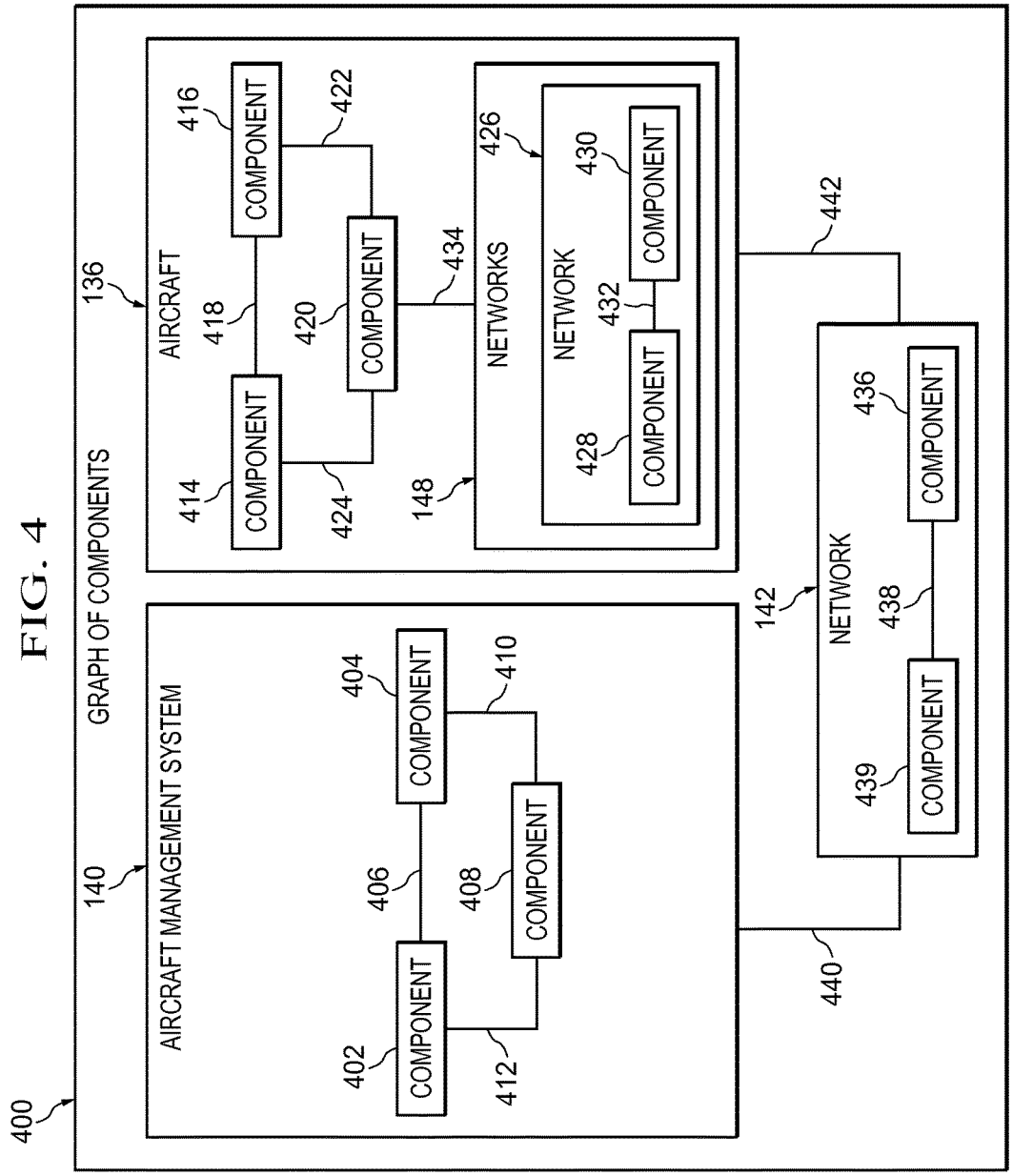
FIG. 4 is an illustration of a block diagram of a graph of components of simulated networks in accordance with an illustrative embodiment.

With reference now to FIG. 4, an illustration of a block diagram of a graph of components of simulated networks is depicted in accordance with an illustrative embodiment. In this illustrative example, one implementation for components 110 in simulation 112 in FIG. 1 is shown.

As depicted, components within aircraft management system 140, aircraft 136, networks 148, and network 142 and the interaction between those components are shown in greater detail in this figures. In this illustrative example, component 402 communicates with component 404 over data link 406. As used herein, a data link is at least one of a physical wire, a physical signaling bus, or other suitable data processing systems used in communications between components.

Component 404 communicates with component 408 over data link 410. Component 408 communicates with component 402 over data link 412. Component 414 communicates with component 416 over data link 418. Component 416 communicates with component 420 over data link 422. Component 420 communicates with component 414 over data link 424.

As illustrated, network 426 in networks 148 is an example of a network in aircraft 136. Component 428 communicates with component 430 over data link 432. As depicted, at least one of component 428 and component 430 may communicate with component 420 over data link 434. Component 439 communicates with component 436 over data link 438. At least one of component 439 and component 436 may facilitate communications between components of aircraft management system 140 and aircraft 136 over data link 440 and data link 442.

In the illustrated example, graph of components 400 may be used in a process for generating virtual implementations of components. Graph of components 400 may also be used in a process of displaying real time views of simulations. In this example, the real time view may include a graph view that shows graph of components 400. Further, the displaying of a state for a component in graph of components 400 may be implemented by displaying the state on or near the component.

The illustration of aircraft network simulation environment 100 and the components within aircraft network simulation environment 100 in FIGS. 1-4 are not meant to imply physical or architectural limitations to the manner in which an illustrative embodiment may be implemented. Other components in addition to or in place of the ones illustrated may be used. Some components may be optional.

Also, the blocks are presented to illustrate some functional components. One or more of these blocks may be combined, divided, or combined and divided into different blocks when implemented in an illustrative embodiment.

For example, all or a portion of threat manager 180, comparator 176, virtual component generator 108, and real time view generator 172 in aircraft network simulation system 104 may be implemented in another computer system other than computer system 106.

As another example, display system 166 may be implemented in a client computer of operator 102. In this example, user interface 164 may be web pages of a web browser running in display system 166. In this example, aircraft network simulation system 104 may include a web server for providing real time views 174 over a network to the client computer of operator 102.

Figure 5:
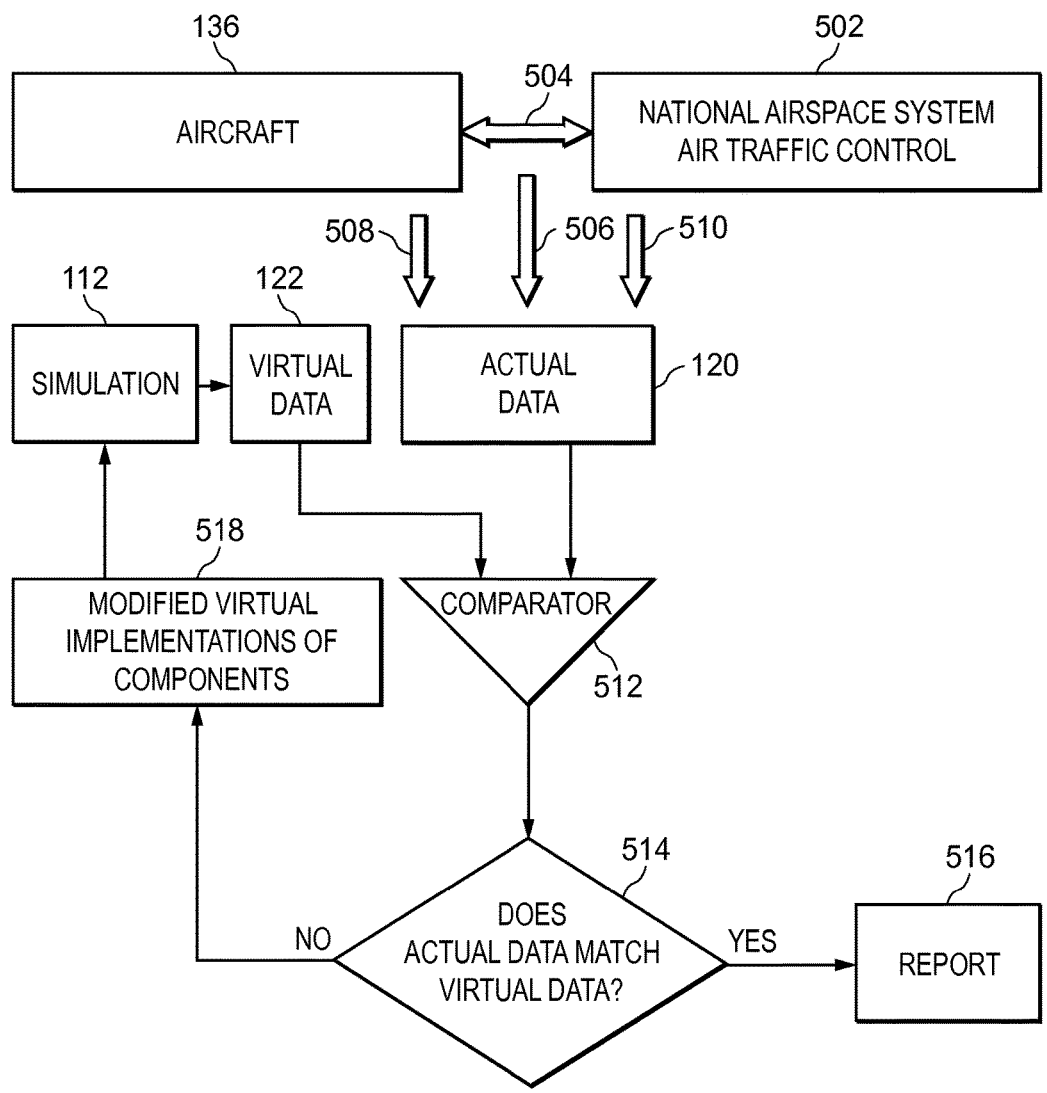
FIG. 5 is an illustration of a process for managing a simulation of aircraft networks in accordance with an illustrative embodiment.

Turning next to FIG. 5, an illustration of a process for managing a simulation of aircraft networks is depicted in accordance with an illustrative embodiment. The process illustrated in FIG. 5 may be implemented in aircraft network simulation environment 100 using aircraft network simulation system 104 in FIG. 1.

As depicted, national airspace system air traffic control 502 is an example of aircraft management system 140 in FIG. 1. As also depicted, communications 504 are between aircraft 136 and national airspace system air traffic control 502.

In the illustrated example, actual data 120 includes flight data 506, flight data 508, and flight data 510. Flight data 506 is based on communications 504. Flight data 508 is based on actual flight data from components of aircraft 136. Flight data 510 is based on actual flight data from components of national airspace system air traffic control 502.

In this illustrative example, comparator 512 takes virtual data 122 and actual data 120 as input. As depicted, determination 514 is made based on output from comparator 512 as to whether actual data 120 matches virtual data 122. In the illustrated example, report 516 is generated indicating a success responsive to actual data 120 matching virtual data 122.

As depicted, responsive to actual data 120 not matching virtual data 122, the process continues by generating modified virtual implementations of components 518. For example, modified virtual implementations of components 518 may be based on modifications to characteristics of components in simulation 112. In this illustrative example, the process continues with performing simulation 112 based on modified virtual implementations of components 518.

The process in FIG. 5 is a continual process. For example, actual flight data from aircraft 136, national airspace system air traffic control 502, and communications 504 may continually flow into the process improving actual data 120.

Figure 6:
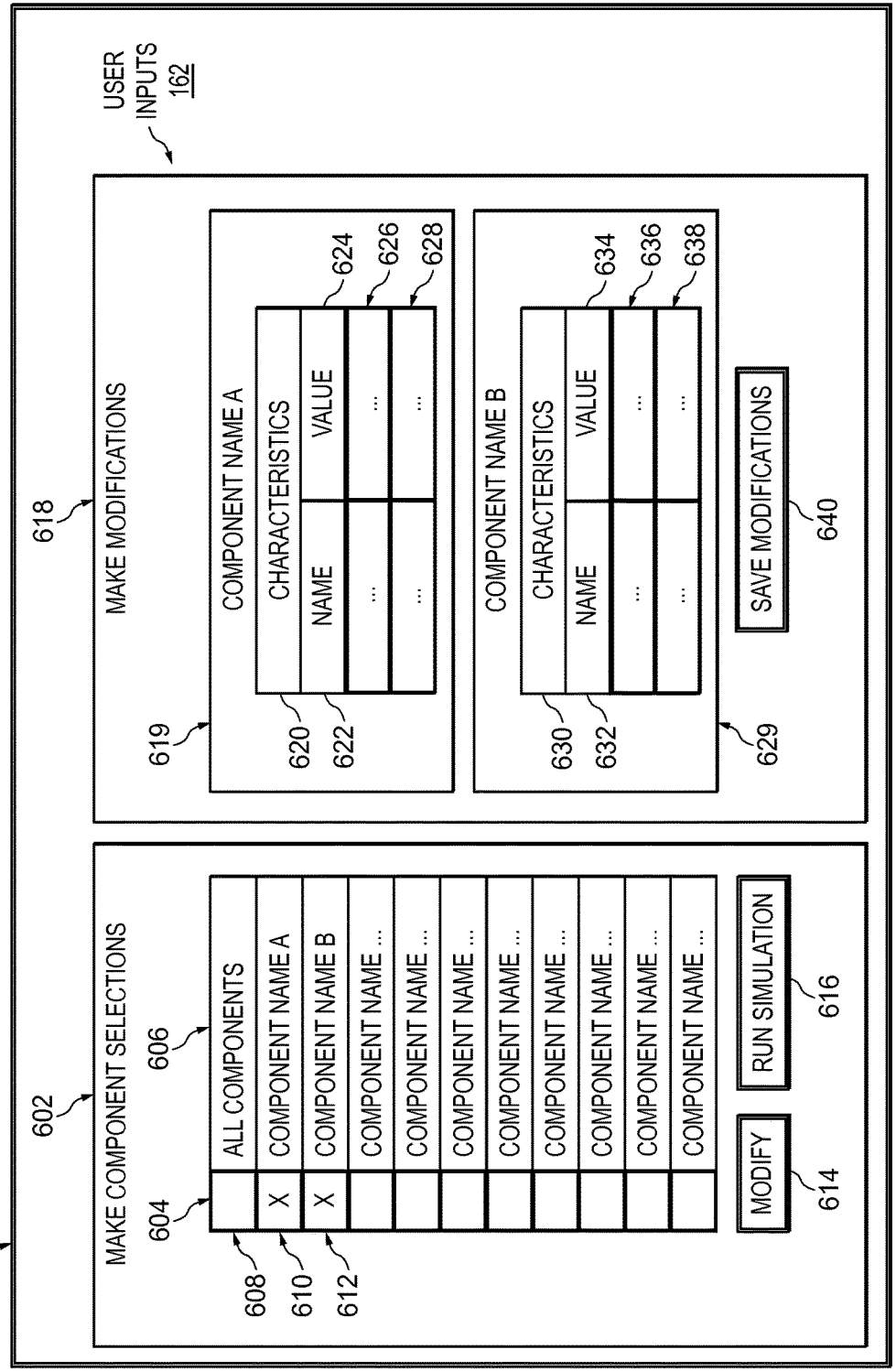
FIG. 6 is an illustration of a graphical user interface for selecting components of aircraft networks and modifying characteristics of the selected components in accordance with an illustrative embodiment.

With reference next to FIG. 6, an illustration of a graphical user interface for selecting components of aircraft networks and modifying characteristics of the selected components is depicted in accordance with an illustrative embodiment. User inputs 162 in user interface 164 in FIG. 6 are visual illustrations of user inputs 162 in user interface 164 shown in block form in FIG. 1.

As depicted, make component selections 602 is a window in user interface 164 for making selections 604 of components 606. Selections 604 are examples of selections 168 in FIG. 1 and components 606 are an example of components 116 in FIG. 1. For example, selections 604 of components 606 may be based on a model, a sub-model, a type, a configuration for airline modifiable information, a certification requirement, or some combination thereof.

As depicted, responsive to user input making selection 608, all components in components 606 are selected. In this illustrative example, selection 610 and selection 612 are made by user inputs 162 selecting "COMPONENT NAME A" and "COMPONENT NAME B," respectively.

In this illustrated example, modify 614 is a button for initiating a process to modify selected components in components 606. Run simulation 616 is a button for initiating a process to simulate selected components in components 606.

As depicted, make modifications 618 is a window shown in user interface 164 responsive to user input selecting the button modify 614. In this illustrative example, window 619 for "COMPONENT NAME A" is shown including characteristics 620 of "COMPONENT NAME A." Characteristics 620 are a table of examples of characteristics 114 in FIG. 1. In this illustrative example, name 622 and value 624 are columns of the table of name value pairs of characteristics 620. Name value pair 626 and name value pair 628 are examples of characteristics 620.

In the illustrative example, window 629 for "COMPONENT NAME B" is shown including characteristics 630 of "COMPONENT NAME B." Characteristics 630 are a table of examples of characteristics 114 in FIG. 1.

In this illustrative example, name 632 and value 634 are columns of the table of name value pairs of characteristics 630. Name value pair 636 and name value pair 638 are examples of characteristics 630. Save modifications 640 is a button used to initiate a process for saving changes made via user inputs 162 to characteristics 620 and characteristics 630.

Figure 7:
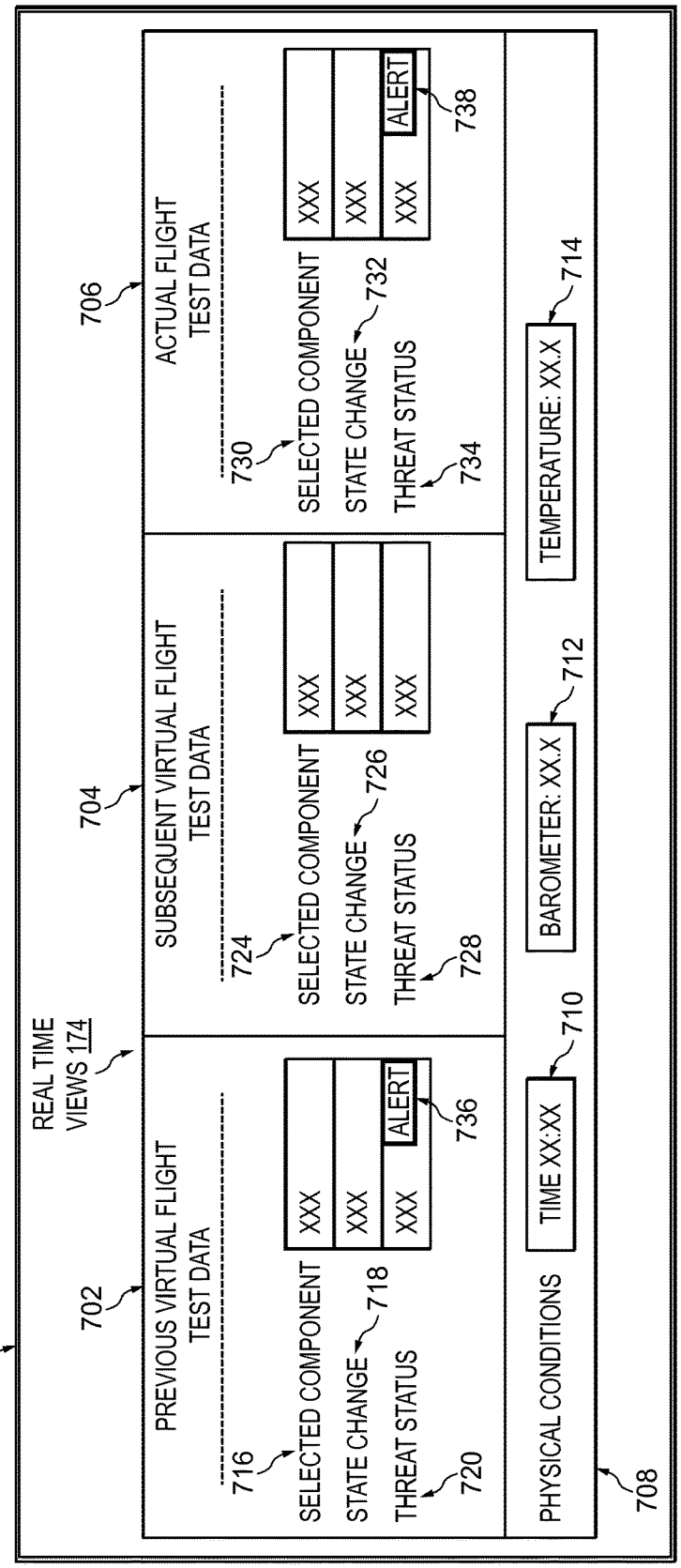
FIG. 7 is an illustration of a graphical user interface for displaying real time views of simulations in accordance with an illustrative embodiment.

Turning next to FIG. 7, an illustration of a graphical user interface for displaying real time views of simulations is depicted in accordance with an illustrative embodiment. Real time views 174 in user interface 164 in FIG. 7 are visual illustrations of real time views 174 in user interface 164 shown in block form in FIG. 1.

As depicted, real time view 702, real time view 704, and real time view 706 are windows illustrating real time views 174. As also depicted, real time view 702 is showing information based on previous virtual flight test data, real time view 704 is showing information based on subsequent virtual flight test data, and real time view 706 is showing information based on actual flight test data. In this manner, a visual comparison can be shown to an operator for flight test data between the flight test data of previous simulations, subsequent simulations, and actual flights. Visual differences between the real times views may be determined.

In this illustrative example, physical conditions 708 is a window in user interface 164 that shows time 710, barometer 712, and temperature 714. As depicted, time 710, barometer 712, and temperature 714 are examples of physical conditions 160 in FIG. 1.

In the illustrated example, selected component 716, state change 718, and threat status 720 are examples of information displayed in real time views 174 to show a previous performing of simulation 112 in FIG. 1. For example, selected component 716 may be an example of component 200 in FIG. 2. In this example, state change 718 and threat status 720 are examples of state 212 for logical characteristics in characteristics 202 in FIG. 2.

As depicted, selected component 724, state change 726, and threat status 728 are examples of information displayed in real time views 174 to show a subsequent performing of simulation 112 in FIG. 1. Selected component 724 is another example of component 200 in FIG. 2. In this example, state change 726 and threat status 728 are examples of state 212 for logical characteristics in characteristics 202 in FIG. 2. As also depicted, selected component 730, state change 732, and threat status 734 are examples of information displayed in real time views 174 to show actual data 120 in FIG. 1. Selected component 730 is another example of component 200 in FIG. 2.

In this example, state change 732 and threat status 734 are examples of state 212 for logical characteristics in characteristics 202 in FIG. 2. Alert 736 and alert 738 are shown in user interface 164 to indicate where differences are located between characteristics shown in real time views 174. As an example, a user can determine differences between the first one of real time views 174, such as real time view 702, and the second one of real time views 174, such as real time view 704, real time view 706, or both.

Figure 8:
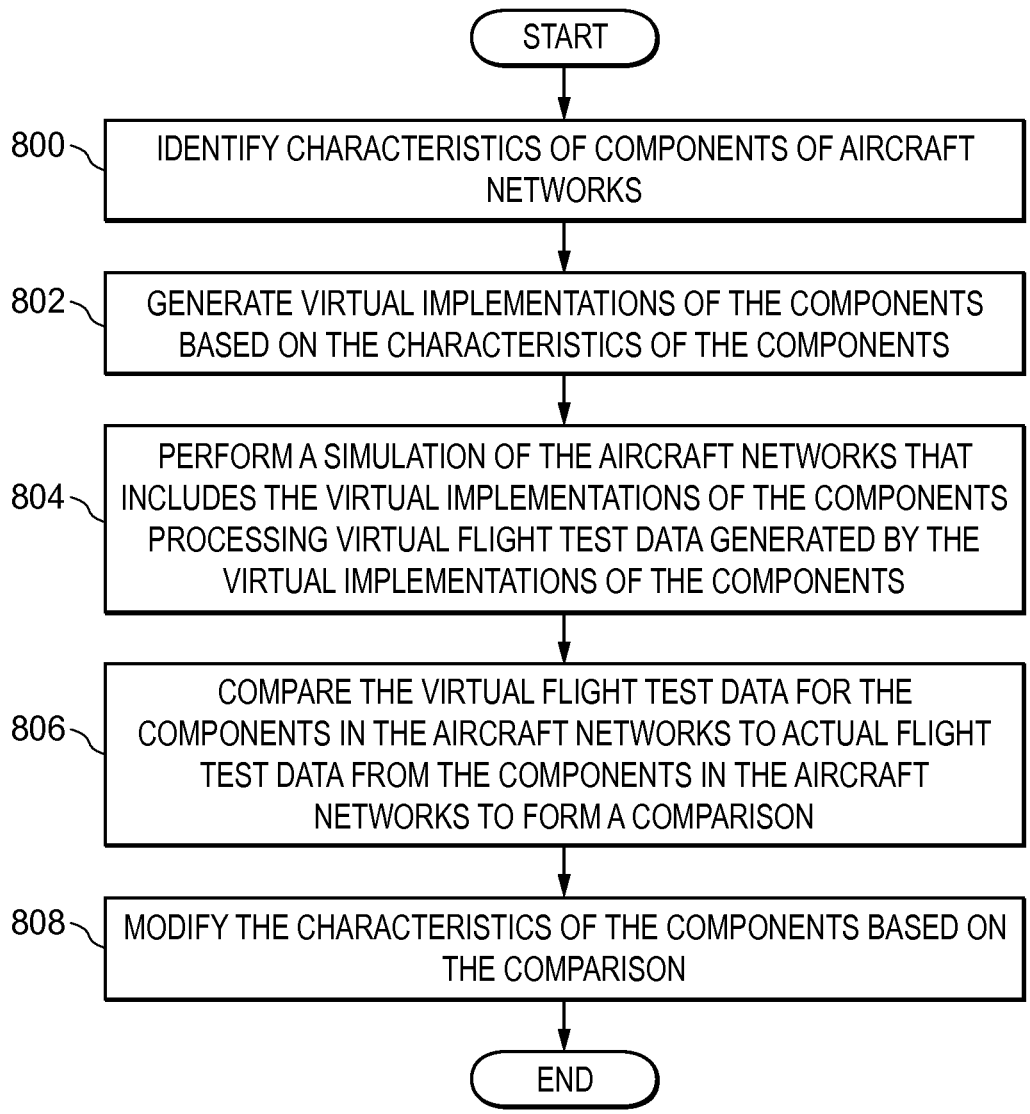
FIG. 8 is an illustration of a flowchart of a process for performing a simulation of aircraft networks in accordance with an illustrative embodiment.

With reference now to FIG. 8, an illustration of a flowchart of a process for performing a simulation of aircraft networks is depicted in accordance with an illustrative embodiment. The process illustrated in FIG. 8 may be implemented in aircraft network simulation environment 100 in FIG. 1. In particular, one or more of the different operations illustrated may be implemented using aircraft network simulation system 104 in FIG. 1. The first set of networks in this process is an example of networks 148 and networks 150 in FIG. 1. The second set of networks in this process is network 146, network 142, and network 144 in FIG. 1.

The process begins by identifying characteristics of components of aircraft networks (operation 800). In this illustrative example, the aircraft networks include a first set of networks within a plurality of aircraft and a second set of networks configured for communication between the plurality of aircraft.

The process generates virtual implementations of the components based on the characteristics of the components (operation 802). The process next performs a simulation of the aircraft networks that includes the virtual implementations of the components processing virtual flight test data generated by the virtual implementations of the components (operation 804).

The process compares the virtual flight test data for the components in the aircraft networks to actual flight test data from the components in the aircraft networks to form a comparison (operation 806). The process then modifies the characteristics of the components based on the comparison (operation 808), with the process terminating thereafter.

Figure 9:
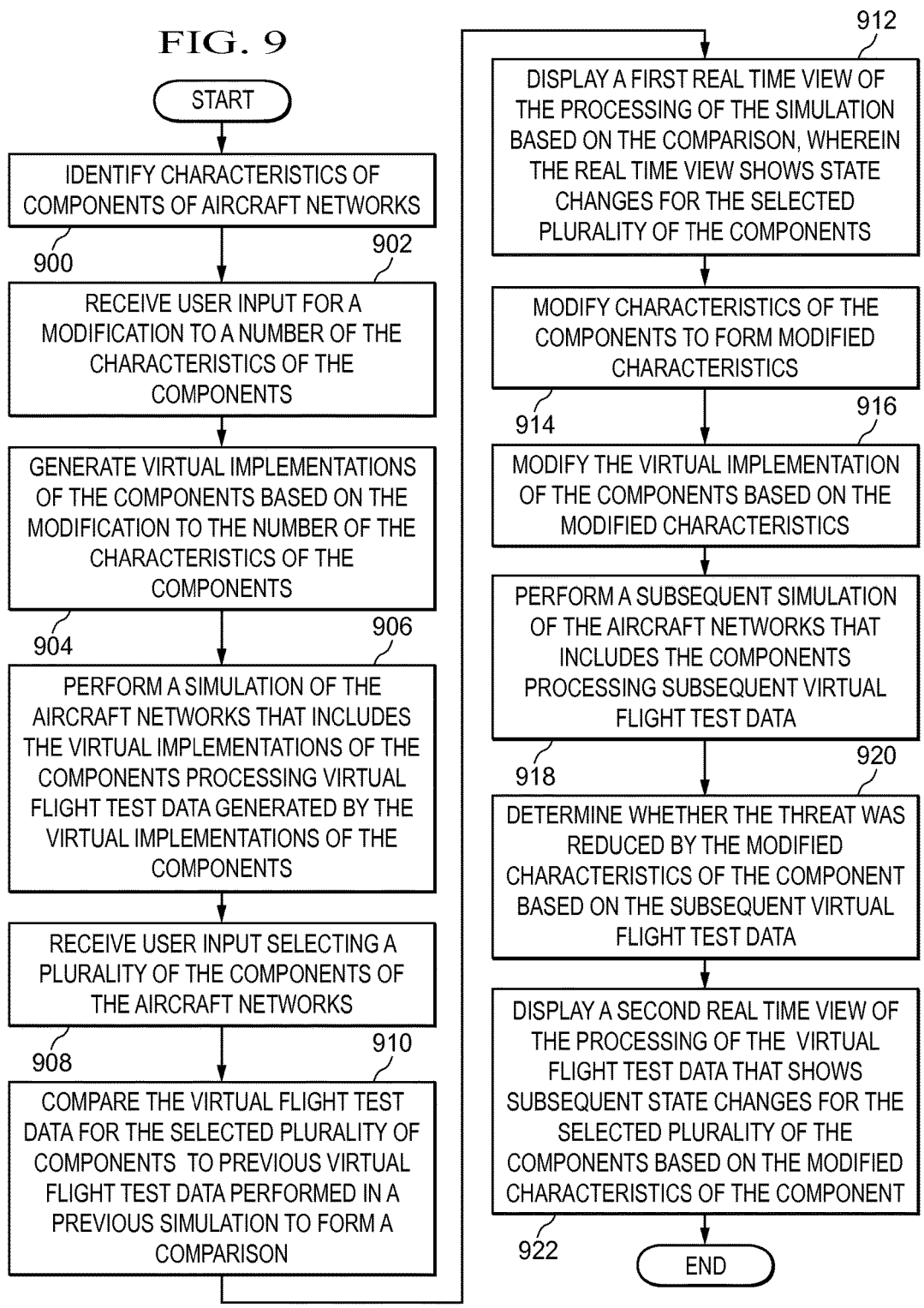
FIG. 9 is an illustration of a flowchart of a process for managing threats using simulated components of aircraft networks in accordance with an illustrative embodiment.

With reference next to FIG. 9, an illustration of a flowchart of a process for managing threats using simulated components of aircraft networks is depicted in accordance with an illustrative embodiment. The process illustrated in FIG. 9 may be implemented in aircraft network simulation environment 100 in FIG. 1. In particular, one or more of the different operations illustrated may be implemented using aircraft network simulation system 104 in FIG. 1.

The process begins by identifying characteristics of components of aircraft networks (operation 900). The process next receives user input for a modification to a number of the characteristics of the components (operation 902). In this illustrative example, the modification represents a threat to a component in the components.

The process generates virtual implementations of the components based on the modification to the number of the characteristics of the components (operation 904).

The process performs a simulation of the aircraft networks that includes the virtual implementations of the components processing virtual flight test data generated by the virtual implementations of the components (operation 906).

The process next receives user input selecting a plurality of the components of the aircraft networks (operation 908). The process compares the virtual flight test data for the selected plurality of components to previous virtual flight test data performed in a previous simulation to form a comparison (operation 910). The process then displays a first real time view of the processing of the simulation based on the comparison, wherein the real time view shows state changes for the selected plurality of the components (operation 912).

The process next modifies characteristics of the component to form modified characteristics (operation 914). The process modifies the virtual implementation of the component based on the modified characteristics (operation 916). The process performs a subsequent simulation of the aircraft networks that includes the components processing subsequent virtual flight test data (operation 918). The process next determines whether the threat was reduced by the modified characteristics of the component based on the subsequent virtual flight test data (operation 920).

The process then displays a second real time view of the processing of the virtual flight test data that shows subsequent state changes for the selected plurality of the components based on the modified characteristics of the component (operation 922), with the process terminating thereafter. In this example, the second real time view shows whether the threat was reduced by the modified characteristics of the component.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 10:
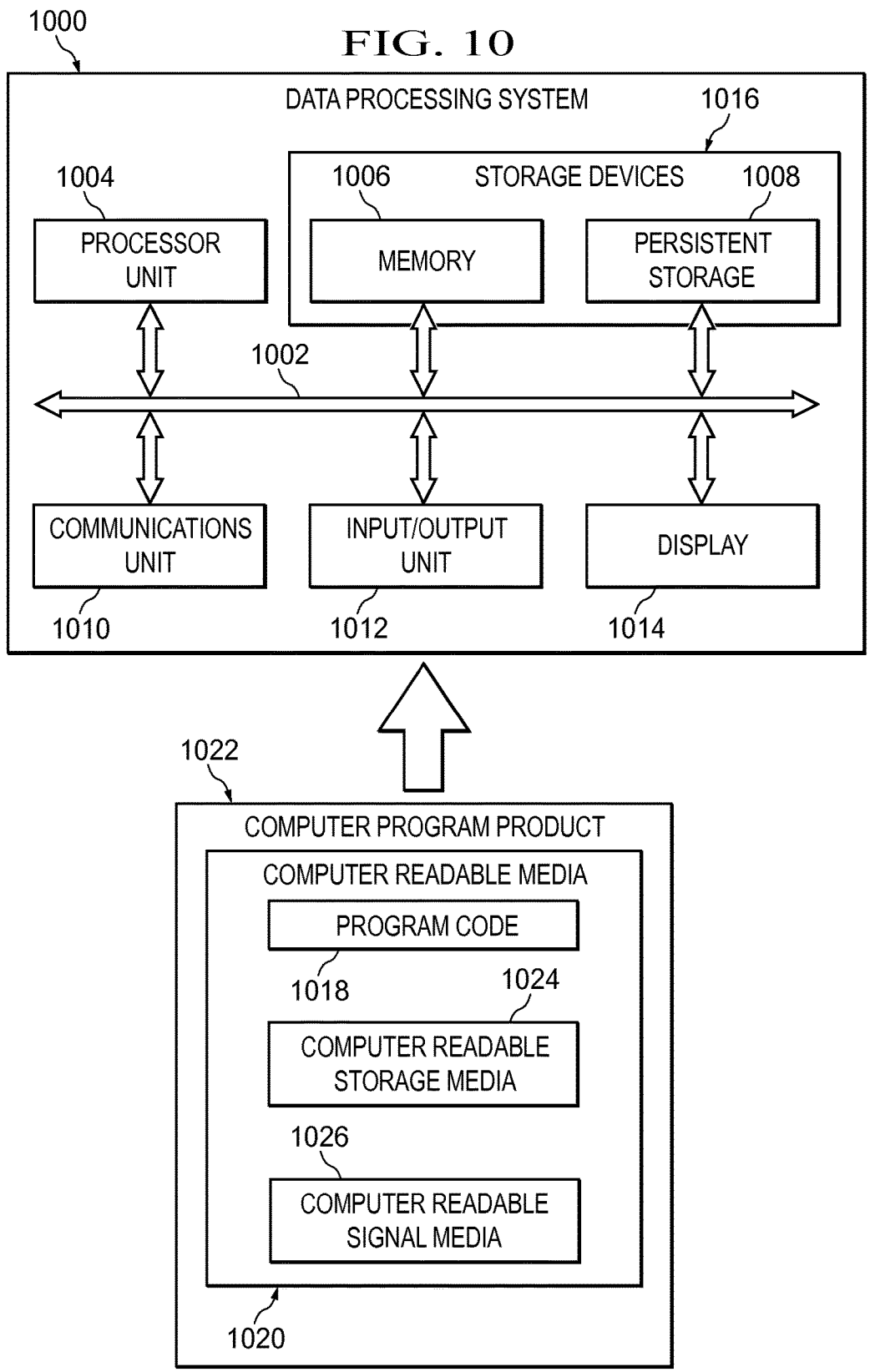
FIG. 10 is an illustration of a block diagram of a data processing system in accordance with an illustrative embodiment.

Turning now to FIG. 10, an illustration of a block diagram of a data processing system is depicted in accordance with an illustrative embodiment. Data processing system 1000 may be used to implement one or more computers in computer system 106, component database 124, component repository 126, and display system 166 in FIG. 1. As depicted, data processing system 1000 includes communications framework 1002, which provides communications between processor unit 1004, storage devices 1016, communications unit 1010, input/output unit 1012, and display 1014. In some cases, communications framework 1002 may be implemented as a bus system.

Processor unit 1004 is configured to execute instructions for software to perform a number of operations. Processor unit 1004 may comprise a number of processors, a multi-processor core, and/or some other type of processor, depending on the implementation. In some cases, processor unit 1004 may take the form of a hardware unit, such as a circuit system, an application specific integrated circuit (ASIC), a programmable logic device, or some other suitable type of hardware unit.

Instructions for the operating system, applications, and/or programs run by processor unit 1004 may be located in storage devices 1016. Storage devices 1016 may be in communication with processor unit 1004 through communications framework 1002. As used herein, a storage device, also referred to as a computer readable storage device, is any piece of hardware capable of storing information on a temporary and/or permanent basis. This information may include, but is not limited to, data, program code, and/or other information.

Memory 1006 and persistent storage 1008 are examples of storage devices 1016. Memory 1006 may take the form of, for example, a random access memory or some type of volatile or non-volatile storage device. Persistent storage 1008 may comprise any number of components or devices. For example, persistent storage 1008 may comprise a hard drive, a flash memory, a rewritable optical disk, a rewritable magnetic tape, or some combination of the above. The media used by persistent storage 1008 may or may not be removable.

Communications unit 1010 allows data processing system 1000 to communicate with other data processing systems and/or devices. Communications unit 1010 may provide communications using physical and/or wireless communications links.

Input/output unit 1012 allows input to be received from and output to be sent to other devices connected to data processing system 1000. For example, input/output unit 1012 may allow user input to be received through a keyboard, a mouse, and/or some other type of input device. As another example, input/output unit 1012 may allow output to be sent to a printer connected to data processing system 1000.

Display 1014 is configured to display information to a user. Display 1014 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer usable program code, or computer readable program code and may be read and executed by one or more processors in processor unit 1004.

In these examples, program code 1018 is located in a functional form on computer readable media 1020, which is selectively removable, and may be loaded onto or transferred to data processing system 1000 for execution by processor unit 1004. Program code 1018 and computer readable media 1020 together form computer program product 1022. In this illustrative example, computer readable media 1020 may be computer readable storage media 1024 or computer readable signal media 1026.

Computer readable storage media 1024 is a physical or tangible storage device used to store program code 1018 rather than a medium that propagates or transmits program code 1018. Computer readable storage media 1024 may be, for example, without limitation, an optical or magnetic disk or a persistent storage device that is connected to data processing system 1000.

Alternatively, program code 1018 may be transferred to data processing system 1000 using computer readable signal media 1026. Computer readable signal media 1026 may be, for example, a propagated data signal including program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

Figure 11:
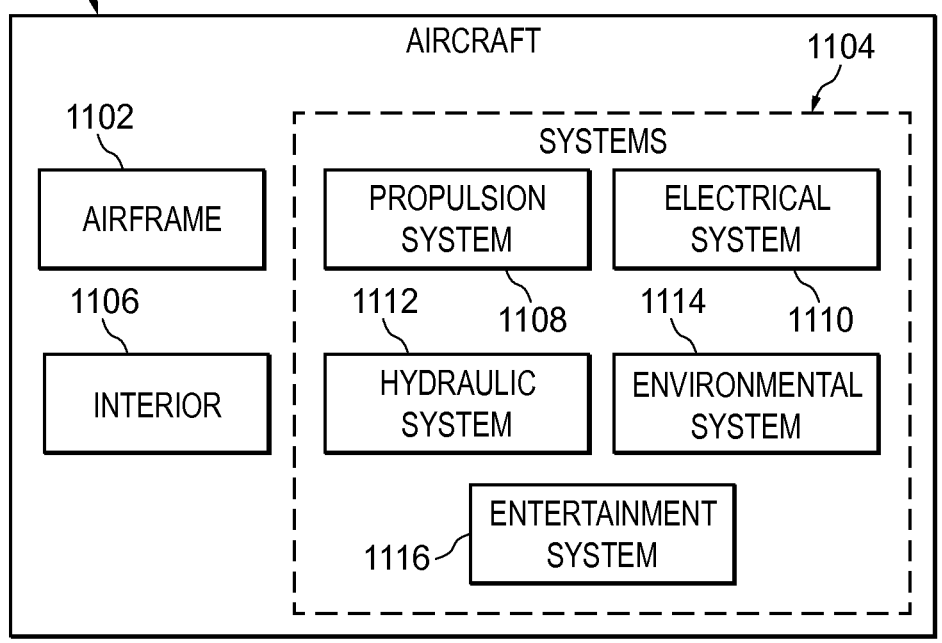
FIG. 11 is an illustration of a block diagram of systems of an aircraft in accordance with an illustrative embodiment.

With reference now to FIG. 11, an illustration of a block diagram of systems of an aircraft is depicted. In this illustrative example, aircraft 1100 is an example of aircraft 136 in FIG. 1 simulated by aircraft network simulation system 104 in FIG. 1. As depicted aircraft 1100 may include airframe 1102 and interior 1106 with systems 1104. Examples of systems 1104 include one or more of propulsion system 1108, electrical system 1110, hydraulic system 1112, environmental system 1114, and entertainment system 1116. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service. For example, one or more illustrative embodiments may be implemented during system integration of new or modified components. The different illustrative examples may be implemented to perform a simulation of systems 1104 of aircraft 1100. In particular, the simulation of aircraft 1100 may be used to manage threats to components of systems 1104.

For example, information about a threat to aircraft 1100 may be defined by modifying characteristics of components of systems 1104. As another example, a threat to aircraft 1100 may be identified in concurrent displays of real time views of simulations of systems 1104. In this example, the different real time views each show an indicator of threats based on simulations of components of systems 1104 of aircraft 1100. More particularly, each simulation shown in parallel can be based on a different set of characteristics of the components. Still other real time views, shown concurrently, may be based on actual flight data of the components of the systems of aircraft 1100.

Thus, the illustrative embodiments provide a method and system for performing simulation 112 of networks 142, 144, 146, 148, and 150. Characteristics 114 of components 116 of the aircraft networks are identified. The aircraft networks include a first set of networks 148 and 150 within a plurality of aircraft 136 and 138 and a second set of networks 142, 144, and 146 configured for communication between the plurality of aircraft. Virtual implementations of the components are generated based on the characteristics of the components. Simulation 112 of the aircraft networks is performed, the simulation including the virtual implementations of the components processing virtual flight test data generated by the virtual implementations of the components. The virtual flight test data for the components in the aircraft networks is compared to actual flight test data from the components in the aircraft networks to form comparison 178. The characteristics of the components are then modified based on the comparison. By comparing virtual flight test data for the components in the aircraft networks with actual flight test data from the components in the aircraft networks to form a comparison and then modifying characteristics of the components based on the comparison, the simulation may be quickly improved.

Additionally, the illustrative embodiments provide a method and system for managing threat 182 using simulated components 110 of networks 142, 144, 146, 148, and 150. Characteristics 114 of components 116 of the aircraft networks are identified. User inputs 162 are received for modifications 170 to a number of the characteristics of the components. The modification represents threat 182 to a component in the components. Virtual implementations of the components are generated based on the modification to the number of the characteristics of the components. Simulation 112 of the aircraft networks is performed that includes the virtual implementations of the components processing virtual flight test data generated by the virtual implementations of the components. User inputs 162 are received selecting a plurality of the components of the aircraft networks. The virtual flight test data for the selected plurality of components is compared to previous virtual flight test data performed in a previous simulation to form a comparison 178. Real time views 174 of the processing of the simulation are displayed based on the comparison. The real time views show state 212 changes for the selected plurality of the components.

By displaying real time views of simulated and actual flight data that show state changes for a selected plurality of the components, threats to components of aircraft networks can be quickly identified. By allowing user inputs to change characteristics of the components and then showing real time views of simulated results of the changes to the components in parallel with previous simulations, threats to the components can be quickly resolved.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for operating an aircraft, the method comprising:

identifying characteristics of components of aircraft networks on the aircraft, wherein the aircraft networks include a first set of networks configured for communications between in-aircraft components of an aircraft and a second set of networks configured for communication between a plurality of aircraft;

generating virtual implementations of the components based on the characteristics of the components;

performing a simulation of the aircraft networks that includes the virtual implementations of the components processing virtual flight test data generated by the virtual implementations of the components;

comparing the virtual flight test data for the components in the aircraft networks to actual flight test data from the components in the aircraft networks to form a comparison, wherein the virtual flight test data comprise data from the virtual implementations of the components in the first set of networks and the virtual implementations of the components in the second set of networks;

modifying the characteristics of the virtual implementations of the components in the simulation of the aircraft networks based on the comparison;

modifying the characteristics of the components of the aircraft networks in the aircraft only after resolving threats identified from the simulation of the aircraft networks; and operating the aircraft according to the modified characteristics of the components.

2. The method of claim 1, wherein the characteristics of the components include data links between the components and further comprising:

generating a graph of the data links between the components.

3. The method of claim 1, wherein the characteristics of the components include physical characteristics, logical characteristics, and data link characteristics, wherein the physical characteristics include at least one of temperature sensitivity ranges of the components, moisture sensitivity ranges of the components, and electrical sensitivity ranges of the components.

4. The method of claim 3, wherein the logical characteristics include a data flow model.

5. The method of claim 4, wherein the data flow model is based on input of a set of physical conditions of the plurality of aircraft, wherein the set of physical conditions includes at least one of a throttle setting, a flap setting, a control surfaces setting, and a flight phase.

6. The method of claim 1, wherein the first set of networks comprises at least one of an air traffic management system, an in-flight entertainment system, an aircraft health management system, a flight control computer, or an aircraft information system.

7. The method of claim 1, wherein the components include a first set of components of the plurality of aircraft and a second set of components of the second set of networks.

8. The method of claim 1, wherein identifying the characteristics of the components of the aircraft networks comprises:
retrieving the characteristics from a component database.

9. The method of claim 8, wherein identifying the characteristics of the components of the aircraft networks comprises:
retrieving the characteristics from a component repository containing a plurality of different components of the aircraft networks, wherein the characteristics of different components are managed by respective different component owners.

10. The method of claim 1 further comprising:
comparing the virtual flight test data for the components in the aircraft networks to in-service data from the components in the aircraft networks to form a comparison, wherein the in-service data comprise data generated by the plurality of aircraft over a life of each of the plurality of aircraft.

11. An aircraft network simulation system comprising:
a memory having characteristics of components of aircraft networks;
a processor unit; and
aircraft network simulation software executable by the processor unit and configured to:
identify the characteristics of the components of the aircraft networks on the aircraft, wherein the aircraft networks include a first set of networks configured for communications between in-aircraft components of an aircraft and a second set of networks configured for communication between a plurality of aircraft;
generate virtual implementations of the components based on the characteristics of the components;
perform a simulation of the aircraft networks that includes the virtual implementations of the components processing virtual flight test data generated by the virtual implementations of the components;
compare the virtual flight test data for the components in the aircraft networks to actual flight test data from the components in the aircraft networks to form a comparison, wherein the virtual flight test data comprise data from the virtual implementations of the components in the first set of networks and the virtual implementations of the components in the second set of networks;
modify the characteristics of the virtual implementations of the components in the simulation of the aircraft networks based on the comparison; and
modify the characteristics of the components of the aircraft networks in the aircraft only after resolving threats identified from the simulation of the aircraft networks.

12. The aircraft network simulation system of claim 11, wherein the characteristics of the components include physical characteristics, logical characteristics, and data link characteristics, wherein the physical characteristics include at least one of temperature sensitivity ranges of the components, moisture sensitivity ranges of the components, and electrical sensitivity ranges of the components.

13. The aircraft network simulation system of claim 12, wherein the logical characteristics include a data flow model.

14. The aircraft network simulation system of claim 13, wherein the data flow model is based on input of a set of physical conditions of the plurality of aircraft, and wherein the set of physical conditions includes at least one of a throttle setting, a flap setting, a control surfaces setting, and a flight phase.

15. The aircraft network simulation system of claim 11, wherein the second set of networks comprises at least one of an air traffic management system, an in-flight entertainment system, an aircraft health management system, a flight control computer, or an aircraft information system.

16. The aircraft network simulation system of claim 11, wherein the components include a first set of components of the plurality of aircraft and a second set of components of the second set of networks.

17. A method for managing threats using simulated components of aircraft networks, the method comprising:
identifying characteristics of the components of the aircraft networks;
generating virtual implementations of the components based on the characteristics of the components;
performing a simulation of the aircraft networks that includes the virtual implementations of the components processing virtual flight test data generated by the virtual implementations of the components;
comparing the virtual flight test data for the components in the aircraft networks to actual flight test data from the components in the aircraft networks to form a comparison, wherein the virtual flight test data comprise data from the virtual implementations of the components;
modifying the characteristics of the virtual implementations of the components in the simulation of the aircraft networks based on the comparison;
displaying a real time view of the processing of the simulation based on the comparison, wherein the real time view shows state changes for a selected plurality of the components; and
modifying the characteristics of the components of the aircraft networks in the aircraft only after resolving threats identified from the simulation of the aircraft networks.

18. The method of claim 17, wherein the real time view is a first real time view and further comprising:
modifying characteristics of the component in the components to form modified characteristics;
modifying the virtual implementation of the component based on the modified characteristics;

performing a subsequent simulation of the aircraft networks that includes the virtual implementations of the components processing subsequent virtual flight test data;

determining whether the threat was reduced by the modified characteristics of the component based on the subsequent virtual flight test data; and displaying a second real time view of the processing of the virtual flight test data that shows subsequent state changes for the selected plurality of the components based on the modified characteristics of the component, wherein the second real time view shows whether the threat was reduced by the modified characteristics of the component.

19. The method of claim 18, wherein the second real time view is displayed concurrently with the first real time view.

20. The method of claim 19 further comprising:

determining differences between the first real time view and the second real time view; and displaying an indicator for at least one of the differences.

21. The method of claim 17, wherein the aircraft networks include a first set of networks within the plurality of aircraft and a second set of networks configured for communication between the plurality of aircraft, and wherein the characteristics of the components include physical characteristics, logical characteristics, and data link characteristics.

22. The method of claim 21, wherein the logical characteristics include a data flow model.

23. The method of claim 22, wherein the data flow model is based on input of a set of physical conditions of the plurality of aircraft, wherein the set of physical conditions includes at least one of a throttle setting, a flap setting, a control surfaces setting, and a flight phase.

24. The method of claim 23, wherein displaying a view of the components of the aircraft networks comprises:

displaying the set of physical conditions of the plurality of aircraft.

\* \* \* \* \*